(12) United States Patent
Jeong (10) Patent No.: US 12,469,831 B2
(45) Date of Patent: Nov. 11, 2025

(54) DISPLAY DEVICE

(71) Applicant: Samsung Display Co., Ltd., Yongin-si (KR)

(72) Inventor: Jongyun Jeong, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 936 days.

(21) Appl. No.: 17/670,848

(22) Filed: Feb. 14, 2022

(65) Prior Publication Data

US 2022/0386470 A1    Dec. 1, 2022

(30) Foreign Application Priority Data

May 25, 2021  (KR) .......................... 10-2021-0066963

(51) Int. Cl.
*H10K 59/131*   (2023.01)
*H01L 25/16*   (2023.01)
*H05K 1/14*   (2006.01)
*H05K 1/18*   (2006.01)
*H10D 86/40*   (2025.01)
*H10D 86/60*   (2025.01)
*H10K 59/80*   (2023.01)

(52) U.S. Cl.
CPC ........... *H01L 25/167* (2013.01); *H05K 1/147* (2013.01); *H05K 1/189* (2013.01); *H10D 86/441* (2025.01); *H10D 86/60* (2025.01); *H10K 59/131* (2023.02); *H10K 59/8723* (2023.02); *H05K 2201/10128* (2013.01)

(58) Field of Classification Search
CPC ........ H01L 25/167; H05K 2201/10128; H05K 1/147

See application file for complete search history.

(56) References Cited

U.S. PATENT DOCUMENTS

2013/0026505 A1   1/2013   Lee et al.
2014/0049522 A1   2/2014   Mathew et al.
(Continued)

FOREIGN PATENT DOCUMENTS

CN         104835804 A  *  8/2015   .......... H05K 1/0259
KR      1020060001712 A       1/2006
(Continued)

*Primary Examiner* — Jeff W Natalini
*Assistant Examiner* — Jacob Raul Marin
(74) *Attorney, Agent, or Firm* — CANTOR COLBURN LLP (57) ABSTRACT

A display device may include a driving element substrate including a plurality of driving elements, a circuit board disposed on a first surface of the driving element substrate in a first direction, a cover substrate disposed to overlap the driving element substrate on a second surface of the driving element substrate in a second direction opposite to the first direction, where the cover substrate includes a protrusion protruding from the driving element substrate to an outside in a third direction intersecting to the first direction, and includes a connection line, a conductive spacer disposed between the driving element substrate and the cover substrate to electrically connect the driving element substrate and the cover substrate, and a circuit film including a first end connected to the protrusion of the cover substrate and a second end connected to the circuit board and opposite to the first end.

15 Claims, 8 Drawing Sheets (56) References Cited

U.S. PATENT DOCUMENTS

| | | | |
|---|---|---|---|
| 2015/0036300 A1* | 2/2015 | Park | H05K 1/147 |
| | | | 156/212 |
| 2018/0090696 A1* | 3/2018 | Jang | H10D 86/85 |
| 2020/0295114 A1* | 9/2020 | Moon | H05K 1/118 |
| 2021/0022248 A1* | 1/2021 | Lim | H05K 3/323 |
| 2021/0066437 A1 | 3/2021 | Ryu et al. | |
| 2021/0097944 A1* | 4/2021 | Li | H05K 5/0247 |

FOREIGN PATENT DOCUMENTS

| | | |
|---|---|---|
| KR | 1020130014367 A | 2/2013 |
| KR | 1020140023223 A | 2/2014 |
| KR | 101963125 B1 | 4/2019 |
| KR | 102102946 B1 | 4/2020 |
| KR | 1020210028295 A | 3/2021 |

* cited by examiner

DISPLAY DEVICE

This application claims priority to Korean Patent Application No. 10-2021-0066963, filed on May 25, 2021, and all the benefits accruing therefrom under 35 U.S.C. § 119, the content of which in its entirety is herein incorporated by reference.

BACKGROUND

1. Field

Embodiments relate to a display device. More particularly, embodiments relate to a display device including a circuit board.

2. Description of the Related Art

The flat panel display device is being widely used as a display device in various fields due to various desired characteristics such as light weight and thinness. Such flat panel display devices may include a liquid crystal display device and an organic light emitting display device, for example.

The display device may include a pixel and a circuit board. The circuit board may transmit various signals to the pixel so that the display device may emit light. For example, the circuit board may transmit a gate signal, a data signal, a driving voltage, etc. to the pixel. In the display device, the circuit board and the pixel are electrically connected to each other.

SUMMARY

Embodiments may provide a display device including a circuit board.

An embodiment of a display device includes a driving element substrate including a plurality of driving elements, a circuit board disposed on a first surface of the driving element substrate in a first direction, a cover substrate disposed to overlap the driving element substrate on a second surface of the driving element substrate in a second direction opposite to the first direction, where the cover substrate includes a protrusion protruding from the driving element substrate to an outside in a third direction intersecting to the first direction, and the cover substrate further includes a connection line, a conductive spacer disposed between the driving element substrate and the cover substrate to electrically connect the driving element substrate and the cover substrate, and a circuit film including a first end connected to the protrusion of the cover substrate and a second end connected to the circuit board and opposite to the first end.

In an embodiment, the first end of the circuit film may be connected to a surface of the protrusion of the cover substrate in the first direction.

In an embodiment, the display device may further include a sealing member disposed outside the conductive spacer between the driving element substrate and the cover substrate.

In an embodiment, the conductive spacer may be surrounded by polyimide when viewed in the third direction.

In an embodiment, the display device may further include a light emitting element disposed on the driving element substrate between the driving element substrate and the cover substrate.

In an embodiment, the light emitting element may be electrically connected to the cover substrate, the conductive spacer, and the driving element substrate.

An embodiment of a display device includes a driving element substrate including a plurality of driving elements, a circuit board disposed on a first surface of the driving element substrate in a first direction, a cover substrate disposed to overlap the driving element substrate on a second surface of the driving element substrate in a second direction opposite to the first direction, where the cover substrate includes a first protrusion protruding from the driving element substrate to an outside in a third direction intersecting to the first direction and a second protrusion protruding from the first protrusion in the first direction, and the cover substrate further includes a connection line, a conductive spacer disposed between the driving element substrate and the cover substrate to electrically connect the driving element substrate and the cover substrate, and a circuit film including a first end connected to the second protrusion of the cover substrate and a second end connected to the circuit board and opposite to the first end.

In an embodiment, the first end of the circuit film may be connected to a surface of the second protrusion of the cover substrate in the first direction.

In an embodiment, the display device may further include a sealing member disposed outside the conductive spacer between the driving element substrate and the cover substrate.

In an embodiment, the conductive spacer may be surrounded by polyimide when viewed in the third direction.

In an embodiment, the display device may further include a light emitting element disposed on the driving element substrate between the driving element substrate and the cover substrate.

In an embodiment, the light emitting element may be electrically connected to the cover substrate, the conductive spacer, and the driving element substrate.

An embodiment of a display device includes a driving element substrate including a plurality of driving elements, a circuit board disposed on a first surface of the driving element substrate in a first direction, a cover substrate disposed to overlap the driving element substrate on a second surface of the driving element substrate in a second direction opposite to the first direction, where the cover substrate includes a protrusion protruding from the driving element substrate to an outside in a third direction intersecting to the first direction, and the cover substrate further includes a connection line, a sealing member disposed between the driving element substrate and the cover substrate, where the driving element substrate and the cover substrate are separated from each other by the sealing member, and a circuit film including a first end connected to the protrusion of the cover substrate and a second end connected to the circuit board and opposite to the first end.

In an embodiment, the first end of the circuit film may be connected to a surface of the protrusion of the cover substrate in the first direction.

In an embodiment, the sealing member may include a conductive material therein, and the cover substrate and the driving element substrate are electrically connected to each other by the sealing member.

In an embodiment, the display device may further include a light emitting element disposed on the driving element substrate between the driving element substrate and the cover substrate.

In an embodiment, the light emitting element may be electrically connected to the cover substrate, the sealing member, and the driving element substrate.

Embodiments of a display device may include a driving element substrate including a plurality of driving elements, a circuit board disposed on a first surface of the driving element substrate in a first direction, a cover substrate disposed to overlap the driving element substrate on a second surface of the driving element substrate in a second direction opposite to the first direction, where the cover substrate includes a protrusion protruding from the driving element substrate to an outside in a third direction intersecting to the first direction, and includes a connection line, a conductive spacer disposed between the driving element substrate and the cover substrate to electrically connect the driving element substrate and the cover substrate, and a circuit film including a first end connected to the protrusion of the cover substrate and a second end connected to the circuit board opposite to the first end.

In such an embodiment, when the circuit film is connected to a surface of the protrusion of the cover substrate in the first direction, a contact area of the circuit film with the side of the cover substrate may be reduced. Accordingly, cracks that may occur in the circuit film may be effectively prevented in advance.

BRIEF DESCRIPTION OF THE DRAWINGS

Illustrative, non-limiting embodiments will be more clearly understood from the following detailed description taken in conjunction with the accompanying drawings.

DETAILED DESCRIPTION

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of a display device and a method of manufacturing the display device will be described in detail with reference to the accompanying drawings.

Figure 1:
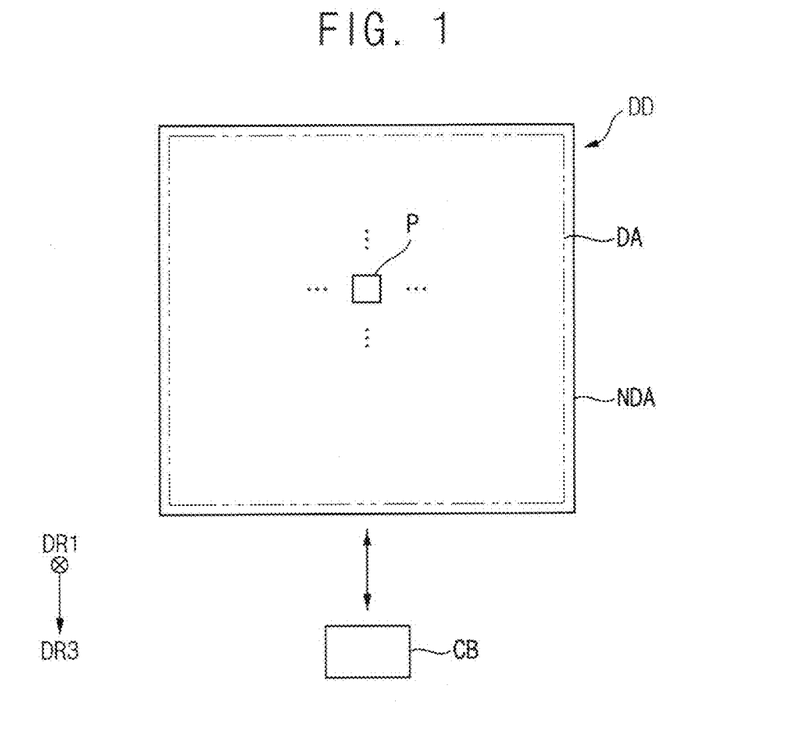
FIGS. 1 and 2 are views illustrating a display device according to an embodiment.
Figure 2:
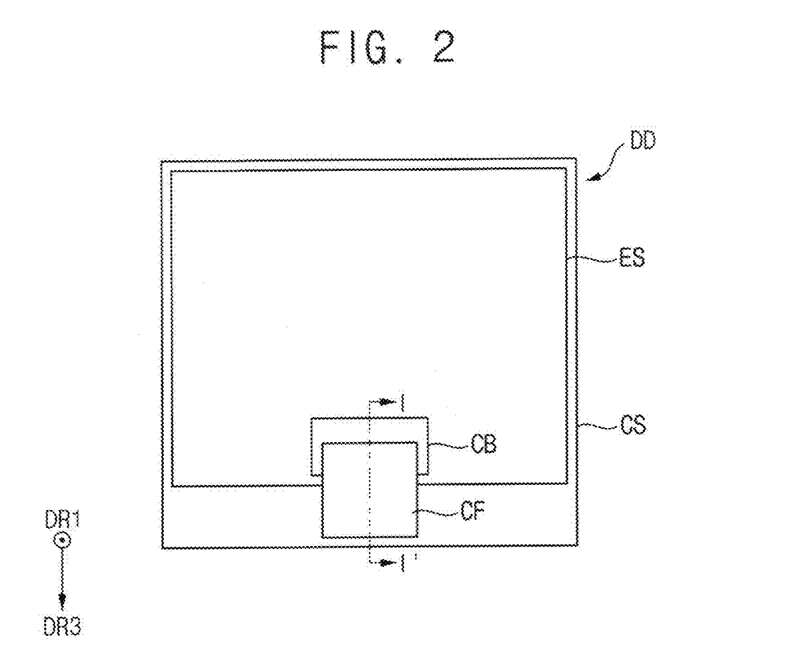

FIGS. 1 and 2 are views illustrating a display device according to an embodiment.

Referring to FIGS. 1 and 2, an embodiment of the display device DD may include a display area DA and a non-display area NDA surrounding the display area DA. A plurality of pixels P may be disposed in the display area DA to emit light. The plurality of pixels P may be disposed throughout the display area DA. In one embodiment, for example, the plurality of pixels P may be disposed throughout the display area DA in a matrix form. Each of the plurality of pixels P may include driving elements and a light emitting element. The driving elements may drive the light emitting element based on a signal transmitted from a circuit board CB. The circuit board CB may transmit a gate signal, a data signal, a driving voltage, etc. to the plurality of pixels P. The display device may display a desired image in the display area DA by the plurality of pixels P.

In such an embodiment, the circuit board CB is connected to one side of the display device DD. In one embodiment, for example, the circuit board CB may be disposed on the first surface of the display device DD in a first direction DR1 to reduce the non-display area NDA. Here, when a surface is in a certain direction, it means that the surface is facing the certain direction, or a plane defined by the surface is perpendicular to the certain direction. In such an embodiment, the circuit board CB may not be disposed on a second surface on which the display device DD emits light, and thus the display area DA may increase. Here, the second surface may be defined as a surface opposite to the first surface.

The circuit board CB may be connected to each of the plurality of pixels P by a plurality of lines. The plurality of lines may be connected to the plurality of pixels P via the non-display area NDA. The circuit board CB may be connected to the circuit film CF, and the circuit film CF may be bent and disposed on the second surface. In an embodiment, the circuit film CF may have flexibility. In such an embodiment, damage such as cracks may occur at a portion in which the circuit film CF contacts a side of the display device DD.

In an embodiment, as illustrated in FIG. 2, where a circuit board CB is attached on the first surface of the display device DD, and a circuit film CF is also attached on the first surface of the display device DD to transmit signals to the plurality of pixels P, the circuit film CF may not come into contact with the side of the display device DD. Accordingly, in such an embodiment, damage such as cracks that may occur in the circuit film CF may be effectively prevented.

The display device DD may include a driving element substrate ES on which the driving elements are disposed and a cover substrate CS on the driving element substrate ES. The driving elements may include a transistor, a capacitor, and the like. In an embodiment, the cover substrate CS may include glass or a polymer resin. In one embodiment, for example, where cover substrate CS includes the glass, the display device DD may have a rigid characteristic. Alternatively, the display device DD may include a thin glass to have a flexible characteristic. In one embodiment, for example, where the cover substrate CS includes the polymer resin, the display device DD may have a flexible characteristic.

The cover substrate CS may partially overlap the driving element substrate ES. A portion of the cover substrate CS may protrude outward from the driving element substrate ES. In an embodiment, as illustrated in FIG. 2, the cover substrate CS may have a protrusion that overlaps the driving element substrate ES and protrudes in a third direction DR3 perpendicular to the first direction DR1.

The circuit board CB may be disposed in the first direction DR1 of the driving element substrate ES. A first end of the circuit film CF may be electrically connected to the circuit board CB, and a second end opposite to the first end of the circuit film CF may be electrically connected to the cover substrate CS. In such an embodiment, the circuit board CB may be electrically connected to the circuit film CF and the cover substrate CS.

Figure 3:
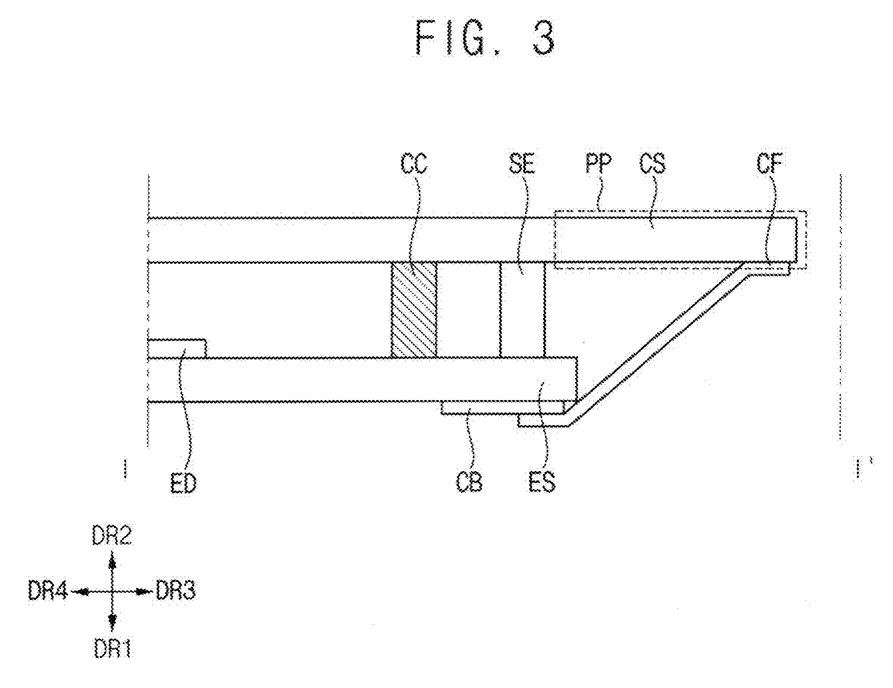
FIG. 3 is a cross-sectional view illustrating an embodiment corresponding to a cross-section taken along line I-I' of FIG. 2.

FIG. 3 is a cross-sectional view illustrating an embodiment corresponding to a cross-section taken along line I-I' of FIG. 2.

Referring to FIG. 3, in an embodiment of the display device DD, at least one light emitting element ED may be disposed between the driving element substrate ES and the cover substrate CS. The light emitting element ED may be disposed on the driving element substrate ES and may be electrically connected to the driving element substrate ES. In such an embodiment, the light emitting element ED may be electrically connected to a transistor disposed in the driving element substrate ES to receive a signal. The light emitting element ED may include an organic light emitting diode including an organic light emitting material. Alternatively, the light emitting element ED may include an inorganic light emitting diode including an inorganic light emitting material. The light emitting device ED may emit light based on a signal transmitted thereto from the circuit board CB.

The sealing member SE may be disposed between the driving element substrate ES and the cover substrate CS. The sealing member SE may prevent foreign substances such as moisture or dust from penetrating between the driving element substrate ES and the cover substrate CS. Since the light emitting element ED may be vulnerable to moisture, dust, or the like, the sealing member SE may be disposed as a whole to surround or to completely surround the light emitting element ED between the driving element substrate ES and the cover substrate CS. In such an embodiment, the sealing member SE may protect the light emitting element ED from external foreign matter.

The sealing member SE may include at least one selected from various materials capable of preventing the penetration of external foreign substances. In an embodiment, the sealing member SE may be an inorganic material. In one embodiment, for example, the sealing member SE may include a frit. Alternatively, the sealing member SE may include a polymer resin. In one embodiment, for example, the sealing member SE may include polyimide.

The circuit board CB may be disposed under the driving element substrate ES. The circuit board CB may transmit a signal for driving the light emitting element ED to the light emitting element ED. In one embodiment, for example, the circuit board CB may generate a gate signal and transmit the gate signal to the light emitting element ED through the circuit film CF, the cover substrate CS, the conductive spacer CC, and the driving element substrate ES. In such an embodiment, the circuit board CB, the cover substrate CS, the conductive spacer CC, the driving element substrate ES, and the light emitting element ED are electrically connected to each other.

The cover substrate CS may overlap the driving element substrate ES. In an embodiment, the cover substrate CS may include a protrusion PP protruding outward from a region overlapping the driving element substrate ES. A connection line or a connection electrode may be disposed in the cover substrate CS.

The circuit film CF may electrically connect the circuit board CB and the cover substrate CS to each other. A first end of the circuit film CF may be electrically connected to the circuit board CB, and a second end opposite to the first end may be electrically connected to the cover substrate CS. The second end of the circuit film CF may be connected to the cover substrate CS in the first direction DR1 (or a thickness direction) of the protrusion PP of the cover substrate CS. In such an embodiment, a signal generated by the circuit board CB may be transmitted to the cover substrate CS. The circuit film CF may have flexibility and may be bent or folded. Accordingly, the driving element substrate ES and the cover substrate CS may be electrically connected to each other by bending to a certain extent between the driving element substrate ES and the cover substrate CS having a height difference.

If the circuit film CF is connected to a surface of the cover substrate CS in the second direction DR2 opposite to the first direction DR1, that is an upper (or outer) surface of the cover substrate CS, the circuit film CF may be in contact with the side (e.g., an end in the third direction DR3) of the cover substrate CS such that a crack may occur in the film CF. Accordingly, a signal passing through the circuit film CF may not be normally transmitted to the light emitting element ED.

In an embodiment of the display device according to the invention, the circuit film CF is connected to the cover substrate CS in the first direction DR1 of the cover substrate CS, that is, a lower (or an inner) surface of the cover substrate CS, the possibility of occurrence of cracks in the circuit film CF may be reduced.

In an embodiment, the conductive spacer CC may be disposed between the driving element substrate ES and the circuit board CS. The conductive spacer CC may be disposed in a fourth direction DR4 opposite to the third direction DR3 from the sealing member SE. The conductive spacer CC may be disposed closer to the light emitting element ED than the sealing member SE. The conductive spacer CC may include a conductive material. In an embodiment, the conductive spacer CC may have a structure in which a polyimide surrounds the conductive material. The cover substrate CS and the driving element substrate may electrically connected to each other by the conductive spacer CC.

Figure 4:
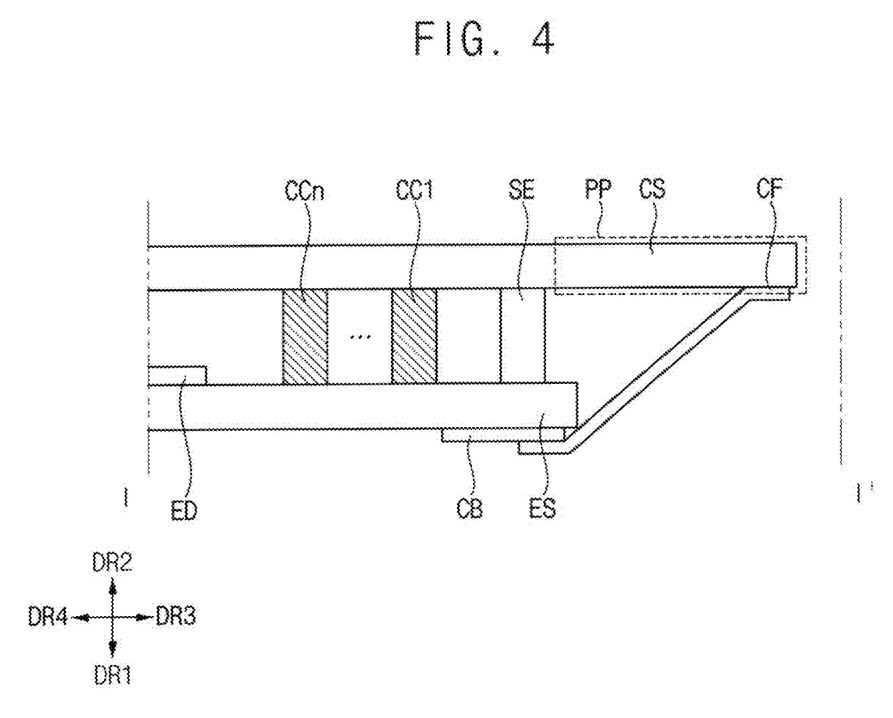
FIG. 4 is a cross-sectional view illustrating an alternative embodiment corresponding to a cross-section taken along line I-I' of FIG. 2.

FIG. 4 is a cross-sectional view illustrating an alternative embodiment corresponding to a cross-section taken along line I-I' of FIG. 2. The embodiment of FIG. 4 may be substantially the same as the embodiment of FIG. 3 except for a plurality of conductive spacers. The same or like elements shown in FIG. 4 have been labeled with the same reference characters as used above to describe the embodiment of the display device shown in FIG. 3, and any repetitive detailed description thereof will hereinafter be omitted or simplified.

Referring to FIG. 4, a plurality of conductive spacers CC1, . . . , CCn may be disposed between the driving element substrate ES and the cover substrate CS (where n is a natural number equal to or greater than 2). The plurality of conductive spacers CC1, . . . , CCn may be respectively connected to different light emitting elements.

Figure 5:
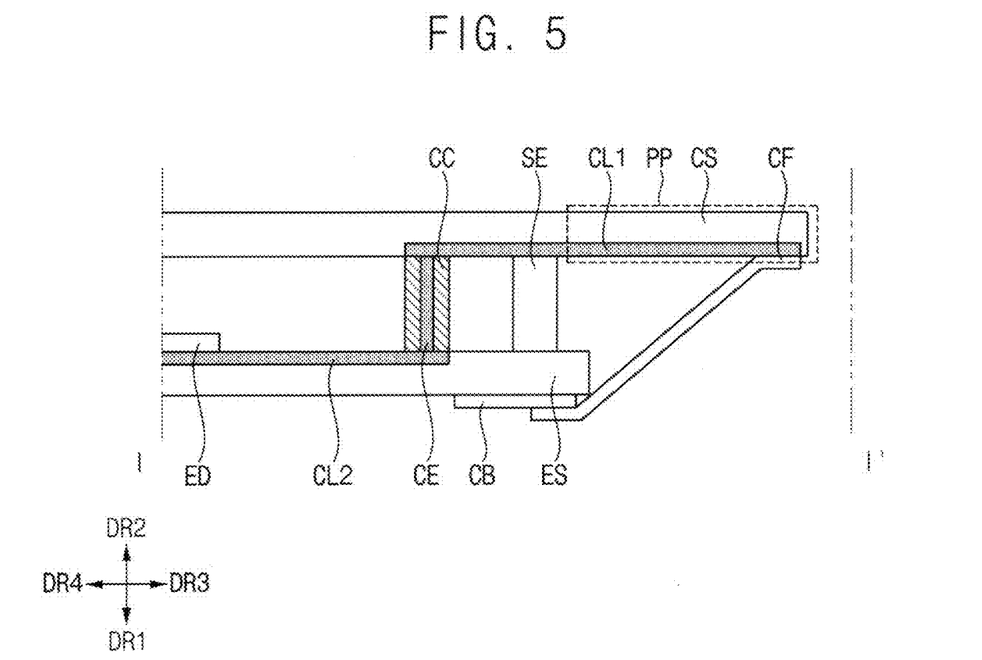
FIG. 5 is a cross-sectional view illustrating an embodiment corresponding to a cross-section taken along line I-I' of FIG. 2.

FIG. 5 is a cross-sectional view illustrating an alternative embodiment corresponding to a cross-section taken along line I-I' of FIG. 2. FIG. 5 may be a view showing an embodiment in which a signal generated from the circuit board CB is transmitted.

Referring to FIG. 5, a signal generated from the circuit board CB may be transmitted to the cover substrate CS through the circuit film CF. The cover substrate CS may include a first connection line CL1. The first connection line CL1 may be disposed inside the cover substrate CS. The first connection line CL1 may directly contact the circuit film CF. Alternatively, the first connection line CL1 may contact the circuit film CF through a contact hole defined in the cover substrate CS to expose the first connection line CL1.

The conductive spacer CC may include a connection electrode CE therein. The connection electrode CE may be connected to the first connection line CL1. The conductive spacer CC may also be connected to a second connection line CL2 disposed in the driving element substrate ES. The second connection line CL2 may be connected to the light emitting element ED.

In FIG. 5, for convenience of illustration and description, the respective components are schematically illustrated as being connected by lines and connecting electrodes extending in one direction, but being limited thereto. In one embodiment, for example, the first connection line CL1 may have a structure in which a plurality of sub connection lines are connected in the cover substrate CS. The second connection line CL2 may refer to a configuration including both a plurality of transistors and a plurality of sub-connection lines.

Figure 6:
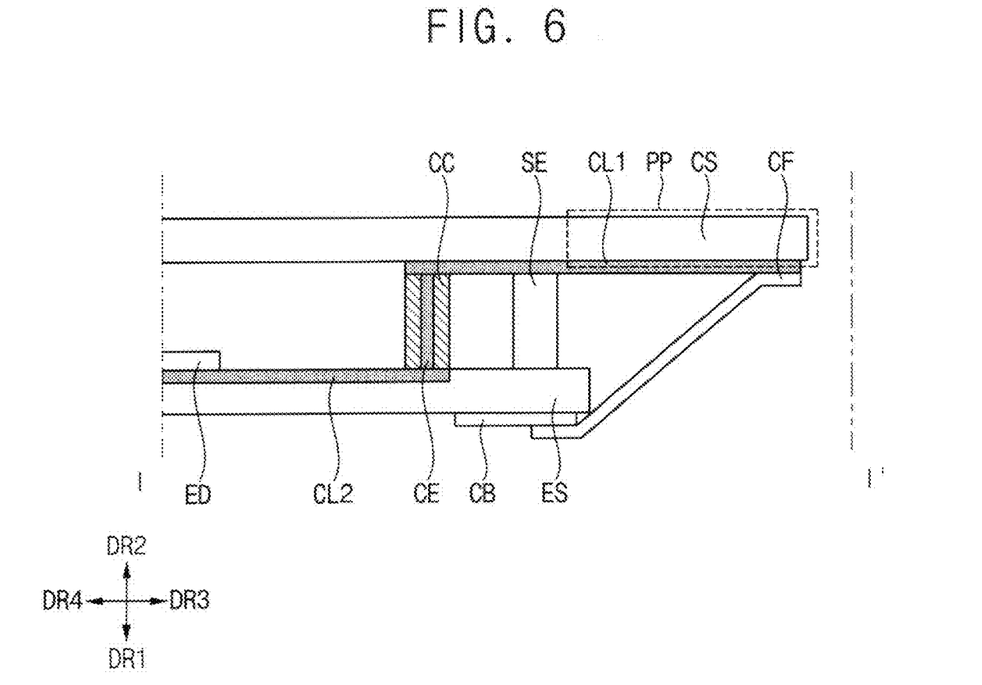
FIG. 6 is a cross-sectional view illustrating an alternative embodiment corresponding to a cross-section taken along line I-I' of FIG. 2.

FIG. 6 is a cross-sectional view illustrating an alternative embodiment corresponding to a cross-section taken along line I-I' of FIG. 2. The embodiment of FIG. 6 may be substantially the same as the embodiment of FIG. 5, except that the first connection line CL1 is disposed on the cover substrate CS. The same or like elements shown in FIG. 6 have been labeled with the same reference characters as used above to describe the embodiment of the display device shown in FIG. 5, and any repetitive detailed description thereof will hereinafter be omitted or simplified.

The first connection line CL1 may be disposed on the cover substrate CS. Accordingly, the second end of the circuit film CF may directly contact the first connection line CL1.

Figure 7:
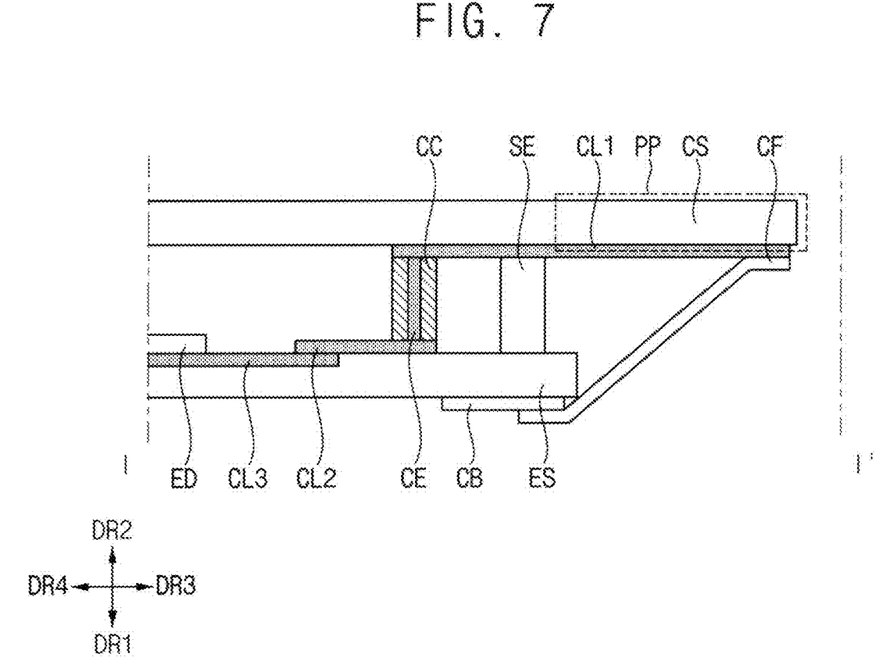
FIG. 7 is a cross-sectional view illustrating another alternative embodiment corresponding to a cross-section taken along line I-I' of FIG. 2.

FIG. 7 is a cross-sectional view illustrating another alternative embodiment a cross-section taken along line I-I' of FIG. 2. The embodiment of FIG. 7 may be substantially the same as the embodiment of FIG. 6 except that the second connection line CL2 is disposed on the driving element substrate ES and a third connection line is disposed in the driving element substrate ES. The same or like elements shown in FIG. 7 have been labeled with the same reference characters as used above to describe the embodiment of the display device shown in FIG. 6, and any repetitive detailed description thereof will hereinafter be omitted or simplified.

Referring to FIG. 7, the second connection line CL2 may be disposed on the driving element substrate ES. The third connection line CL3 may be disposed in the driving element substrate ES. The third connection line CL3 may be connected to the second connection line CL2. The second connection line CL2 may be connected to the third connection line CL3 by various methods. In one embodiment, for example, the second connection line CL2 and the third connection line CL3 may directly contact each other. Alternatively, the second connection line CL2 and the third connection line CL3 may contact each other through a contact hole.

Figure 8:
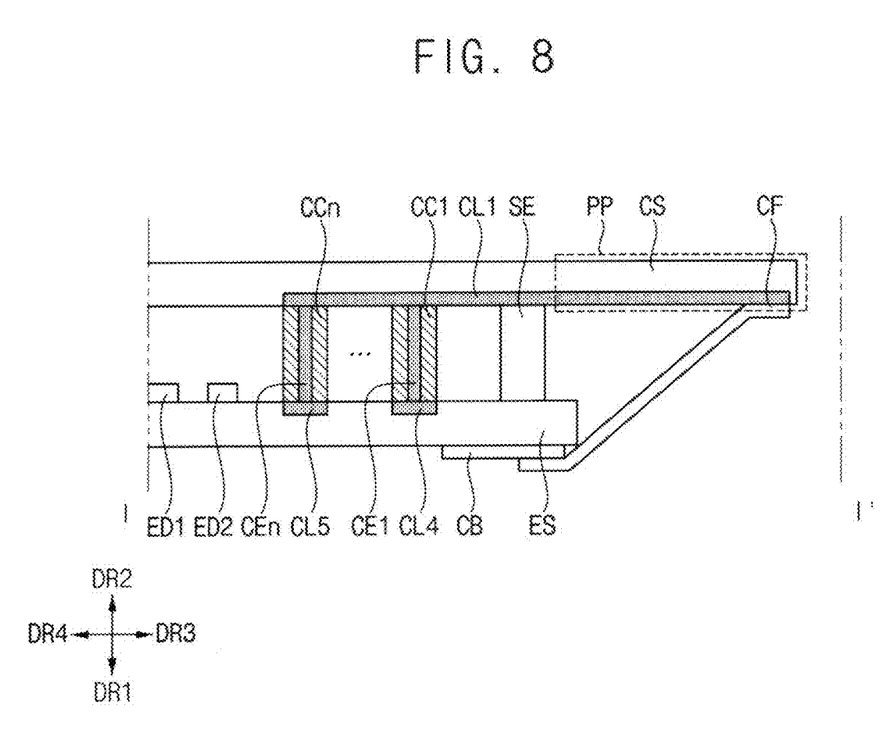
FIG. 8 is a cross-sectional view illustrating another alternative embodiment corresponding to a cross-section taken along line I-I' of FIG. 2.

FIG. 8 is a cross-sectional view illustrating another alternative embodiment a cross-section taken along line I-I' of FIG. 2. FIG. 8 may be a view for explaining an embodiment in which a signal generated from the circuit board CB is transmitted.

Referring to FIG. 8, a plurality of conductive spacers CC1, . . . , CCn may be disposed between the driving element substrate ES and the cover substrate CS (where n is a natural number equal to or greater than 2). The plurality of conductive spacers CC1, . . . , CCn may be respectively connected to different light emitting elements. In one embodiment, for example, the first conductive spacer CC1 may be connected to the first light emitting element ED1, and the second conductive spacer CC2 may be connected to the second light emitting element ED2. Although two light emitting elements ED1 and ED2 are illustrated in FIG. 8 for convenience of illustration, the display device may include three or more light emitting elements.

The first conductive spacer CC1 may include a first connection electrode CE1, and the first connection electrode CE may be surrounded by a polymer material such as polyimide. The n-th conductive spacer CCn may include an n-th connection electrode CEn, and the n-th connection electrode CEn may be surrounded by a polymer material such as polyimide.

A first connection line CL1 may be disposed in the cover substrate CS. The first connection line CL1 may be connected to the plurality of conductive spacers CC1, . . . , CCn.

A signal transmitted by the first connection line CL1 may be transmitted to the fourth connection line CL4 through the first connection electrode CE1. Although not illustrated in the cross-sectional view, the fourth connection line CL4 may be bypassed in the driving element substrate ES and may be electrically connected to the first light emitting element ED1. A signal transmitted by the n-th connection line CLn may be transmitted to the fifth connection line CL5 through the n-th connection electrode CEn. Although not illustrated in the cross-sectional view, the fifth connection line CL5 may also be bypassed in the driving element substrate ES to be electrically connected to the second light emitting element ED2.

Figure 9:
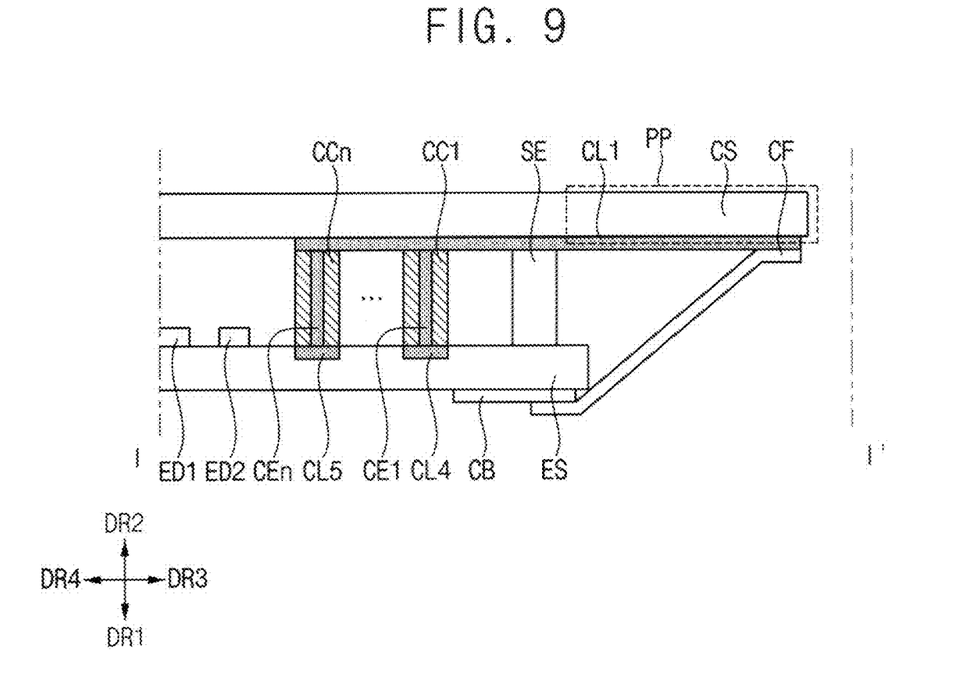
FIG. 9 is a cross-sectional view illustrating another alternative embodiment corresponding to a cross-section taken along line I-I' of FIG. 2.

FIG. 9 is a cross-sectional view illustrating another alternative embodiment a cross-section taken along line I-I' of FIG. 2. The embodiment of FIG. 9 may be substantially the same as the embodiment of FIG. 8, except that the first connection line CL1 is disposed on the cover substrate CS. The same or like elements shown in FIG. 9 have been labeled with the same reference characters as used above to describe the embodiment of the display device shown in FIG. 8, and any repetitive detailed description thereof will hereinafter be omitted or simplified.

The first connection line CL1 may be disposed on the cover substrate CS. Accordingly, the second end of the circuit film CF may directly contact the first connection line CL1.

In an alternative embodiment, although not illustrated, the fourth and fifth connection lines CL4 and CL5 may be disposed on the driving element substrate ES.

Figure 10:
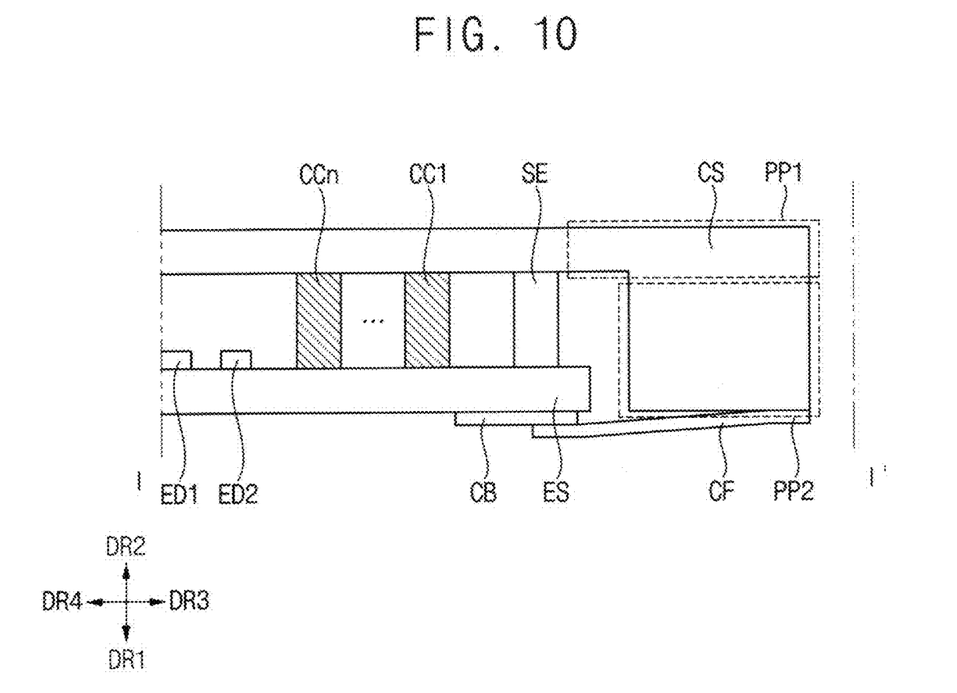
FIG. 10 is a cross-sectional view illustrating another alternative embodiment corresponding to a cross-section taken along line I-I' of FIG. 2.

FIG. 10 is a cross-sectional view illustrating another alternative embodiment a cross-section taken along line I-I' of FIG. 2.

Referring to FIG. 10, in an embodiment, a plurality of light emitting elements ED1 and ED2 may be disposed between the driving element substrate ES and the cover substrate CS. The plurality of light emitting elements ED1 and ED2 may be disposed on the driving element substrate ES and electrically connected to the driving element substrate ES. In such an embodiment, the plurality of light emitting element s ED1 and ED2 may be electrically connected to a transistor disposed in the driving element substrate ES to receive a signal.

The plurality of light emitting elements ED1 and ED2 may include an organic light emitting diode including an organic light emitting material. Alternatively, the plurality of light emitting elements ED1 and ED2 may include an inorganic light emitting diode including an inorganic light emitting material. The plurality of light emitting elements ED1 and ED2 may emit light based on a signal transmitted from the circuit board CB.

The sealing member SE may be disposed between the driving element substrate ES and the cover substrate CS. The sealing member SE may prevent foreign substances from penetrating between the driving element substrate ES and the cover substrate CS. Since the light emitting element ED may be vulnerable to moisture or dust, the sealing member SE is disposed as a whole to surround the light emitting element ED between the driving element substrate ES and the cover substrate CS, and the light emitting element ED may be protected from foreign substances.

The sealing member SE may include at least one selected from various materials that prevents the penetration of external foreign substances. In an embodiment, the sealing member SE may be an inorganic material. In one embodiment, for example, the sealing member SE may include a frit. Alternatively, the sealing member SE may include a polymer resin. In one embodiment, for example, the sealing member SE may include polyimide.

The circuit board CB may be disposed under the driving element substrate ES. The circuit board CB may transmit a signal for driving the light emitting element ED. In one embodiment, for example, the circuit board CB may generate a gate signal and transmit the gate signal to the plurality of light emitting elements ED1 and ED2 through the circuit film CF, the cover substrate CS, the conductive spacer CC and the driving element substrate ES.

The cover substrate CS may overlap the driving element substrate ES. The cover substrate CS may include a first protrusion PP1 protruding outward from a region overlapping the driving element substrate ES. In an embodiment, as shown in FIG. 10, the cover substrate CS may further include a second protrusion PP2 protruding from the first protrusion PP1 in the first direction DR1.

The circuit film CF may connect the circuit board CB and the cover substrate CS. A first end of the circuit film CF may be connected to the circuit board CB, and a second end opposite to the first end may be connected to the cover substrate CS. The second end of the circuit film CF may be connected to the cover substrate CS in the first direction DR1 of the second protrusion PP2 of the cover substrate CS. In such an embodiment, a signal generated by the circuit board CB may be transmitted to the cover substrate CS. The circuit film CF may have flexibility and may be bent or folded. Accordingly, the driving element substrate ES and the cover substrate CS having a height difference may be connected.

When the circuit film CF is connected to a surface in the second direction DR2 opposite to the first direction DR1 of the cover substrate CS, the bent portion of the circuit film CF and the side of the cover substrate CS may come into contact with each other. In this case, a crack or the like may occur in the contact area, so that the signal may not be transmitted normally.

In an embodiment of the display device according to the invention, the circuit film CF is connected to a surface of the cover substrate CS in the first direction DR1, the possibility of occurrence of cracks in the circuit film CF may be reduced.

In an embodiment, a height difference between a portion where the driving element substrate ES and the circuit film CF are connected and a portion where the cover substrate CS and the circuit film CF are connected may be reduced by the second protrusion PP2. In such an embodiment, the stress applied to the circuit film CF by bending may be minimized.

A plurality of conductive spacers CC1, ..., CCn may be disposed between the driving element substrate ES and the circuit board CS (where n is a natural number equal to or greater than 2). The plurality of conductive spacers CC1, ..., CCn may be disposed in a fourth direction DR4 opposite to the third direction DR3 of the sealing member SE. The plurality of conductive spacers CC1, ..., CCn may be disposed closer to the light emitting element ED than the sealing member SE. The plurality of conductive spacers CC1, ..., CCn may include a conductive material. Each of the plurality of conductive spacers CC1, ..., CCn may have a structure in which a conductive material is surrounded by polyimide. The cover substrate CS and the driving element substrate ES may be electrically connected to each other by the plurality of conductive spacers CC1, ..., CCn.

Figure 11:
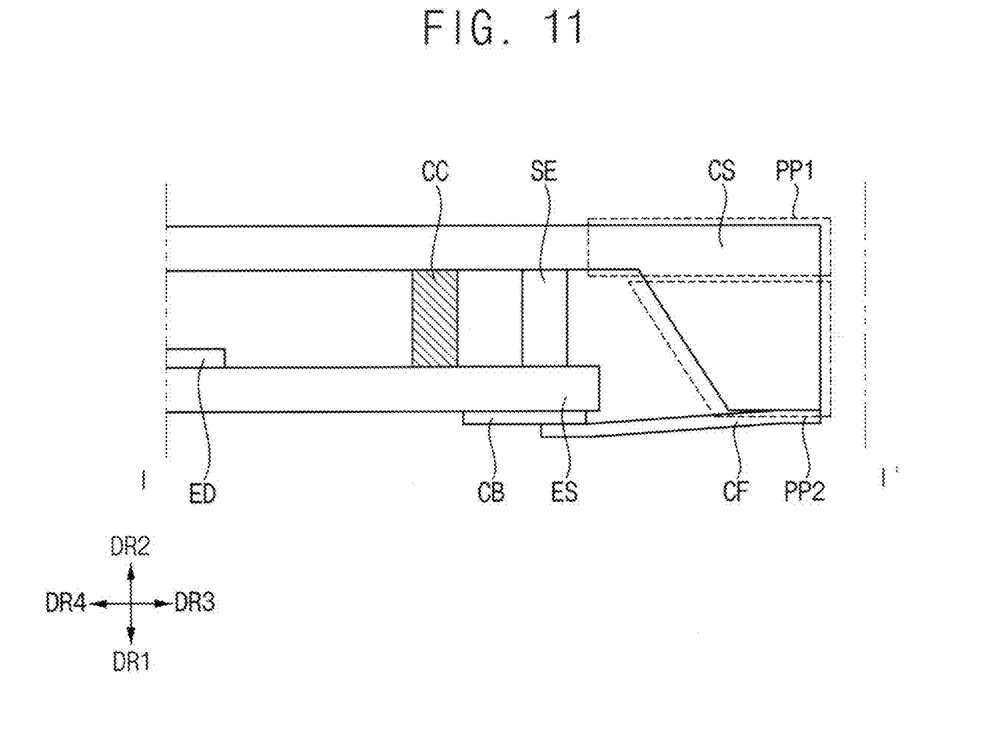
FIG. 11 is a cross-sectional view illustrating another alternative embodiment corresponding to a cross-section taken along line I-I' of FIG. 2.

FIG. 11 is a cross-sectional view illustrating another alternative embodiment a cross-section taken along line I-I' of FIG. 2. The embodiment of FIG. 11 may be substantially the same as the embodiment of FIG. 10 except for the shape of the second protrusion PP2. The same or like elements shown in FIG. 11 have been labeled with the same reference characters as used above to describe the embodiment of the display device shown in FIG. 10, and any repetitive detailed description thereof will hereinafter be omitted or simplified.

Referring to FIG. 11, in an embodiment, the shape of the second protrusion PP2 may be variously modified. In an embodiment, as shown in FIG. 10, the second protrusion PP2 has a rectangular shape. Alternatively, the second protrusion PP2 may have a polygonal shape with one side inclined as shown in FIG. 11. In such an embodiment, the second protrusion PP2 may have one of other various shapes capable of minimizing the stress received by bending the circuit film CF.

Figure 12:
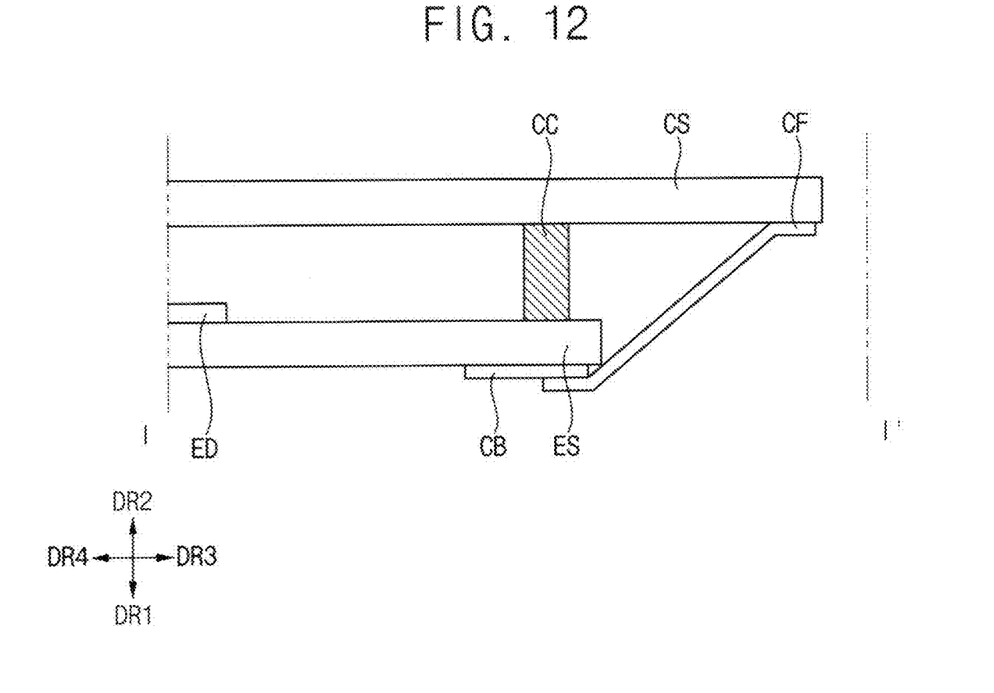
FIG. 12 is a cross-sectional view illustrating another alternative embodiment corresponding to a cross-section taken along line I-I' of FIG. 2.

FIG. 12 is a cross-sectional view illustrating another alternative embodiment a cross-section taken along line I-I' of FIG. 2.

Referring to FIG. 12, in an embodiment, the above-described sealing member SE may not be disposed between the driving element substrate ES and the cover substrate CS. However, since the conductive spacers CC are generally disposed, the conductive spacers CC may instead perform the above-described role of the sealing member SE. The conductive spacer CC may have a structure in which a conductive material is included therein, and a polymer resin such as polyimide surrounds the conductive material from the outside. In an embodiment, as shown in FIG. 12, the conductive spacer CC may be entirely disposed along the edge of the display device to prevent penetration of external foreign matter, and may have a structure partially including a conductive material.

Figure 13:
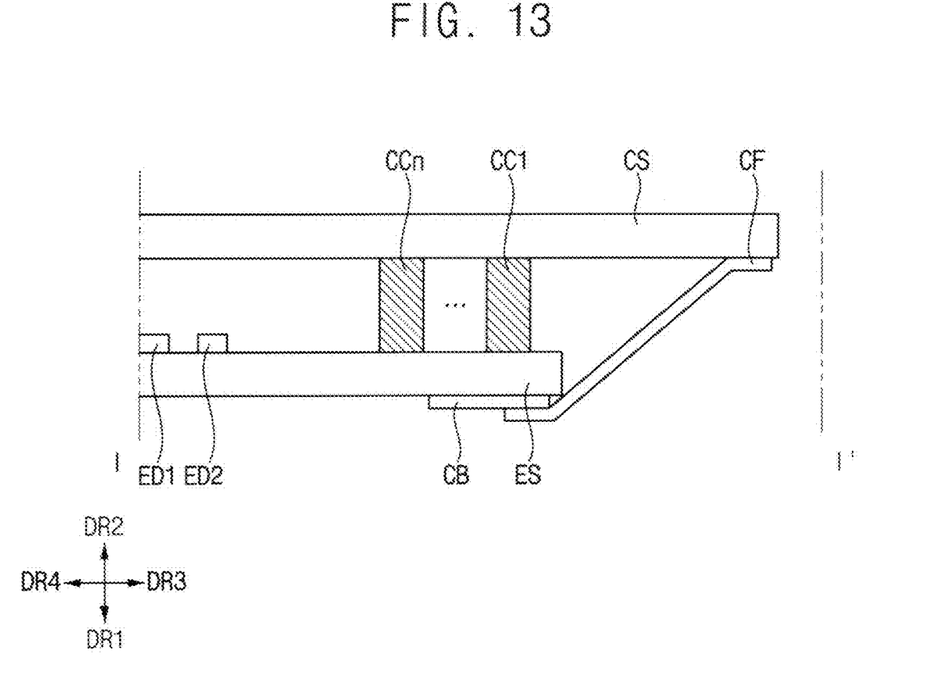
FIG. 13 is a cross-sectional view illustrating another alternative embodiment corresponding to a cross-section taken along line I-I' of FIG. 2.

FIG. 13 is a cross-sectional view illustrating another alternative embodiment a cross-section taken along line I-I' of FIG. 2.

Referring to FIG. 13, in an embodiment, the above-described sealing member SE may not be disposed between the driving element substrate ES and the cover substrate CS. However, since the conductive spacers CC are generally disposed, the conductive spacers CC may instead perform the above-described role of the sealing member SE. The plurality of conductive spacers CC1, ..., CCn may have a structure in which a conductive material is included therein, and a polymer resin such as polyimide or the like surrounds the conductive material from the outside.

In an embodiment, as shown in FIG. 13, the conductive spacers CC may be entirely disposed along the edge of the display device to prevent penetration of external foreign substances, or may have a structure partially including a conductive material.

Figure 14:
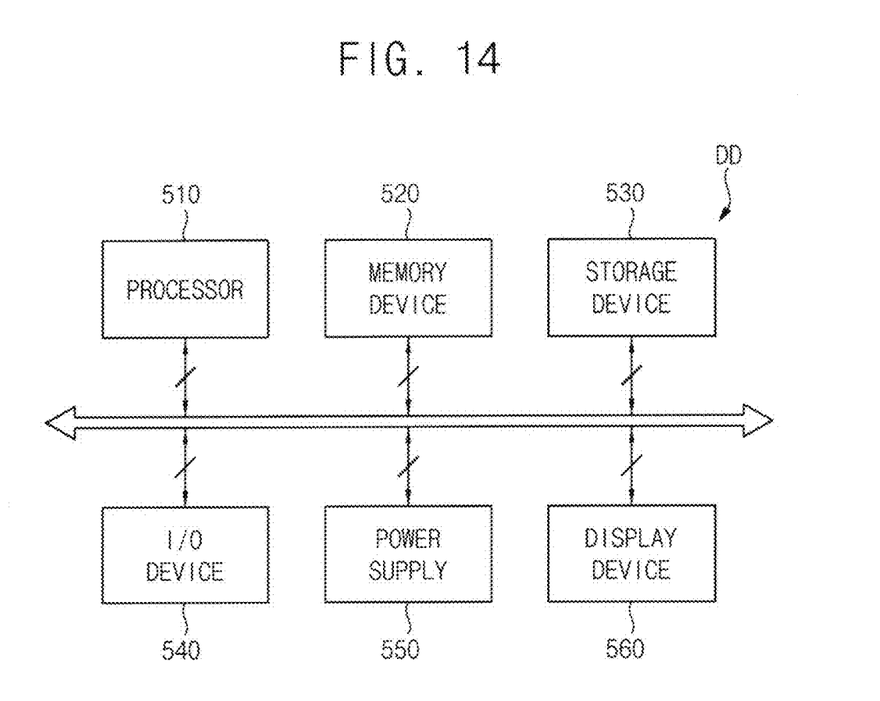
FIG. 14 is a block view illustrating an electronic device according to an embodiment.
Figure 15:
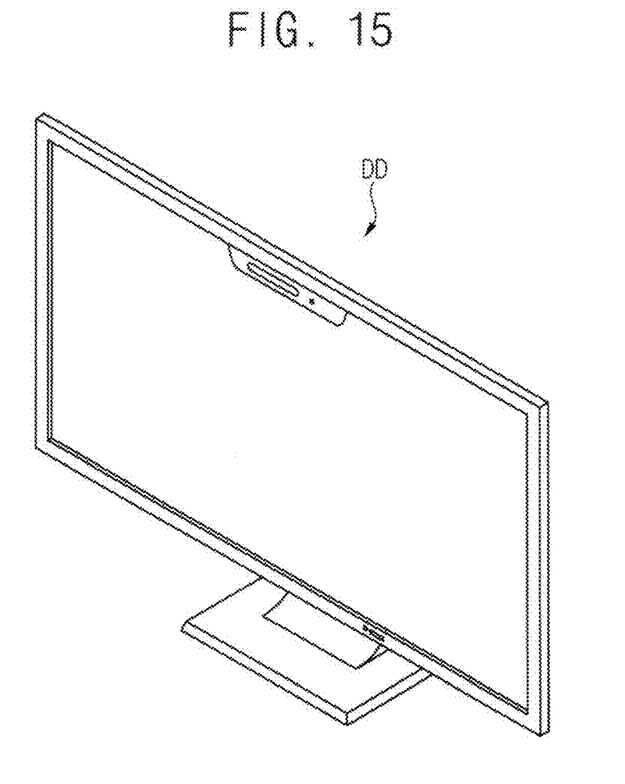
FIG. 15 is a view illustrating an embodiment in which the electronic device of FIG. 18 is implemented as a television.
Figure 16:
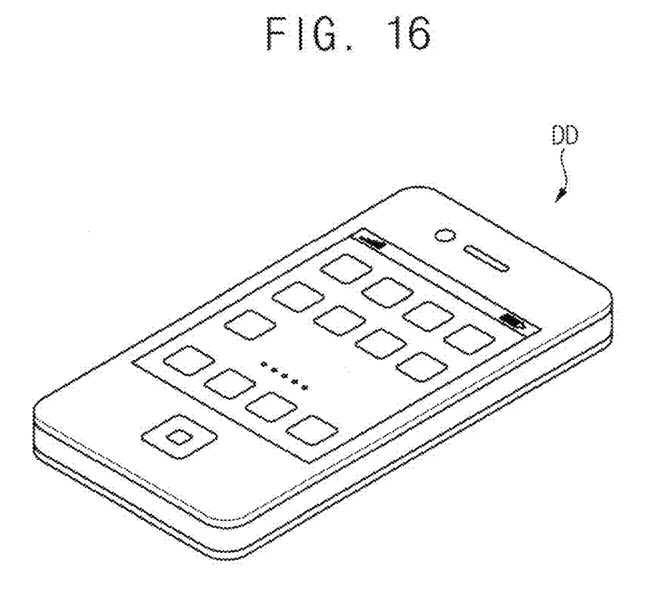
FIG. 16 is a view illustrating an embodiment in which the electronic device of FIG. 18 is implemented as a smartphone.

FIG. 14 is a block view illustrating an electronic device according to an embodiment, FIG. 15 is a view illustrating an embodiment in which the electronic device of FIG. 18 is implemented as a television, and FIG. 16 is a view illustrating an embodiment in which the electronic device of FIG. 18 is implemented as a smartphone.

Referring to FIGS. 14, 15 and 16, an embodiment of an electronic device DD may include a processor 510, a memory device 520, a storage device 530, an input/output device 540, a power supply 550, and a display device 560. In such an embodiment, the display device 560 may correspond to the display device described above with reference to FIGS. 1 to 13. The electronic device DD may further include several ports capable of communicating with a video card, a sound card, a memory card, a USB device, and the like. In an embodiment, as illustrated in FIG. 15, the electronic device DD may be implemented as a television. In an alternative embodiment, as illustrated in FIG. 16, the electronic device DD may be implemented as a smartphone. However, the electronic device DD is not limited thereto, and for example, the electronic device DD includes a mobile phone, a video phone, a smart pad, a smart watch, a tablet PC, a vehicle navigation system, it may be implemented as a computer monitor, notebook computer, head mounted display ("HMD"), or the like.

The processor 510 may perform specific calculations or tasks. In an embodiment, the processor 510 may be a micro processor, a central processing unit ("CPU"), an application processor ("AP"), or the like. The processor 510 may be connected to other components through an address bus, a control bus, a data bus, or the like. In an embodiment, the processor 510 may also be connected to an expansion bus such as a peripheral component interconnect ("PCI") bus.

The memory device 520 may store data used for the operation of the electronic device DD. In one embodiment, for example, the memory device 520 may include nonvolatile memory device such as an erasable programmable read-only memory ("EPROM") device, an electrically erasable programmable read-only memory ("EEPROM") device, a flash memory device, and a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, and/or volatile memory device such as a dynamic random access memory ("DRAM") device, a static random access memory ("SRAM") device, a mobile DRAM device.

The storage device 530 may include a solid state drive ("SSD"), a hard disk drive ("HDD"), a CD-ROM, or the like. The input/output device 540 may include an input means such as a keyboard, a keypad, a touch pad, a touch screen, and a mouse, and an output means such as a speaker and a printer.

Embodiments of the display device may be applied to a display device included in a computer, a notebook, a mobile phone, a smartphone, a smart pad, a personal media player ("PMP"), a personal digital assistant ("PDA"), an MP3 player, or the like.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device, comprising:
a driving element substrate including a plurality of driving elements of a pixel;
a circuit board disposed on a first surface of the driving element substrate in a first direction;
a cover substrate disposed to overlap the driving element substrate on a second surface of the driving element substrate in a second direction opposite to the first direction, wherein the cover substrate includes a protrusion protruding from the driving element substrate to an outside in a third direction intersecting to the first direction, and the cover substrate further includes a connection line;
a conductive spacer disposed between the driving element substrate and the cover substrate to electrically connect the driving element substrate and the cover substrate; and
a circuit film including a first end connected to the protrusion of the cover substrate and a second end connected to the circuit board and opposite to the first end,
wherein the conductive spacer has a structure in which a conductive material is surrounded by polyimide.

2. The display device of claim 1, wherein the first end of the circuit film is connected to a surface of the protrusion of the cover substrate in the first direction.

3. The display device of claim 1, further comprising:
a sealing member disposed outside the conductive spacer between the driving element substrate and the cover substrate.

4. The display device of claim 1, further comprising:
a light emitting element disposed on the driving element substrate between the driving element substrate and the cover substrate.

5. The display device of claim 4, wherein the light emitting element is electrically connected to the cover substrate, the conductive spacer, and the driving element substrate.

6. A display device, comprising:
a driving element substrate including a plurality of driving elements;
a circuit board disposed on a first surface of the driving element substrate in a first direction;
a cover substrate disposed to overlap the driving element substrate on a second surface of the driving element substrate in a second direction opposite to the first direction, wherein the cover substrate includes a first protrusion protruding from the driving element substrate to an outside in a third direction intersecting to the first direction and a second protrusion protruding from the first protrusion in the first direction, and the cover substrate further includes a connection line;
a conductive spacer disposed between the driving element substrate and the cover substrate to electrically connect the driving element substrate and the cover substrate; and
a circuit film including a first end connected to the second protrusion of the cover substrate and a second end connected to the circuit board and opposite to the first end,
wherein the conductive spacer has a structure in which a conductive material is surrounded by polyimide.

7. The display device of claim 6, wherein the first end of the circuit film is connected to a surface of the second protrusion of the cover substrate in the first direction.

8. The display device of claim 6, further comprising:
a sealing member disposed outside the conductive spacer between the driving element substrate and the cover substrate.

9. The display device of claim 6, further comprising:
a light emitting element disposed on the driving element substrate between the driving element substrate and the cover substrate.

10. The display device of claim 9, wherein the light emitting element is electrically connected to the cover substrate, the conductive spacer, and the driving element substrate.

11. A display device, comprising:
a driving element substrate including a plurality of driving elements;
a circuit board disposed on a first surface of the driving element substrate in a first direction;
a cover substrate disposed to overlap the driving element substrate on a second surface of the driving element substrate in a second direction opposite to the first direction, wherein the cover substrate includes a protrusion protruding from the driving element substrate to an outside in a third direction intersecting to the first direction, and the cover substrate further includes a connection line;
a sealing member disposed between the driving element substrate and the cover substrate, wherein the driving element substrate and the cover substrate are separated from each other by the sealing member; and a circuit film including a first end connected to the protrusion of the cover substrate and a second end connected to the circuit board and opposite to the first end, wherein the sealing member has a structure in which a conductive material is surrounded by polyimide.

12. The display device of claim 11, wherein the first end of the circuit film is connected to a surface of the protrusion of the cover substrate in the first direction.

13. The display device of claim 11, wherein the cover substrate and the driving element substrate are electrically connected to each other by the sealing member.

14. The display device of claim 11, further comprising:

a light emitting element disposed on the driving element substrate between the driving element substrate and the cover substrate.

15. The display device of claim 14, wherein the light emitting element is electrically connected to the cover substrate, the sealing member, and the driving element substrate.

\* \* \* \* \*